United States Patent [19]

Steele

[11] Patent Number: 5,194,816
[45] Date of Patent: Mar. 16, 1993

[54] METHOD AND APPARATUS FOR LOCATING ELECTRICAL SHORTS BETWEEN CONCEALED CONDUCTIVE OBJECTS

[75] Inventor: David S. Steele, Wyoming, Ohio

[73] Assignee: Westinghouse Electric Corp., Pittsburgh, Pa.

[21] Appl. No.: 600,464

[22] Filed: Oct. 19, 1990

[51] Int. Cl.⁵ .............................................. G01R 31/08
[52] U.S. Cl. .................................. 324/529; 324/527; 324/521
[58] Field of Search ................. 324/67, 520–524, 324/527–529, 326, 327, 133

[56] References Cited

U.S. PATENT DOCUMENTS

| | | |
|---|---|---|
| 3,617,865 | 11/1971 | Hakata . |
| 3,991,363 | 11/1976 | Lathrop . |
| 4,039,938 | 8/1977 | Link . |
| 4,186,338 | 1/1980 | Fichtenbaum ............ 324/529 X |
| 4,220,913 | 9/1980 | Howell et al. . |
| 4,387,340 | 6/1983 | Peterman . |
| 4,427,942 | 1/1984 | Sole . |
| 4,438,389 | 3/1984 | De Sa . |
| 4,520,317 | 5/1985 | Peterman . |
| 4,639,674 | 1/1987 | Rippingale . |
| 4,686,454 | 8/1987 | Pecukonis . |

*Primary Examiner*—Jack B. Harvey
*Attorney, Agent, or Firm*—R. P. Lenart

[57] ABSTRACT

A method for determining the spacial relationship between concealed elongated conductors wherein a test signal is coupled to a first concealed conductor and conductively coupled to a second adjacent concealed conductor. The relative direction of the current of the test signal on the second conductor is measured on opposite sides of the first conductor. An indication of the relative directions of the current of the test signal on opposite sides of the first conductor can be used to determine if the two conductors are separated or in contact with each other. If the relative direction of the test signal radiated from the second conductor is the same on opposite sides of the first conductor, then the two conductors are separated from each other. If the relative direction of the test signal radiated from the second conductor is opposite on opposite sides of the first conductor, then the two conductors are in contact with each other.

19 Claims, 2 Drawing Sheets

METHOD AND APPARATUS FOR LOCATING ELECTRICAL SHORTS BETWEEN CONCEALED CONDUCTIVE OBJECTS

BACKGROUND OF THE INVENTION

This invention relates to methods and apparatus used to determine if adjacent concealed conductive elements, such as buried pipelines are physically separated from each other or in contact with each other.

Concealed conductive objects such as buried natural gas pipelines are frequently positioned adjacent to each other. If physical contact occurs between adjacent pipelines, associated cathodic protection systems used on those pipelines may be adversely affected and the rate of corrosion at the contact point may greatly increase. It is therefore desirable to determine if adjacent pipelines are in contact with each other without having to excavate the pipelines. Various techniques for locating underground pipelines and cables are well known. Typically, a test signal is inductively or conductively coupled to the pipeline and electromagnetic fields created by that signal are detected and processed to give an indication of the lateral location and depth of the pipeline. However, such techniques do not provide a reliable indication of physical contact or separation between adjacent pipelines. This invention seeks to provide such an indication.

SUMMARY OF THE INVENTION

This invention provides a method for determining the spacial relationship between elongated concealed conductors wherein a test signal applied to a first elongated conductor is conductively coupled to a second elongated conductor which crosses the first conductor. The relative direction of the signal on the second conductor is measured on opposite sides of the first conductor and an indication of the relative direction of that signal at each of the measurement locations is provided. If the relative directions of the measured signal on opposite sides of the first conductor are opposite to each other, the two conductors are determined to be in physical contact with each other. If the relative directions of the measured signal on the opposite sides of the first conductor are the same as each other, then the conductors are determined to be physically separated from each other.

This invention encompasses both the above method for determining the spacial relationship between concealed adjacent conductors and an apparatus for performing that method. The relative direction of the measured signal is determined by the instantaneous polarity of the current in the measured signal relative to the test signal. The relative direction of the measured signal is alternatively referred to as the instantaneous current flow direction.

By determining if adjacent concealed conductors are in contact or separated from each other, potential corrosion points between such adjacent conductors can be rapidly located and corrective action can be taken.

BRIEF DESCRIPTION OF THE DRAWINGS

The invention will become more readily apparent from the following description of the preferred embodiments shown in the accompanying drawings wherein.

DESCRIPTION OF THE PREFERRED EMBODIMENTS

This invention provides a method and apparatus for measuring the relative instantaneous current flow direction of an AC current in a concealed conductor using a portable device and without contacting the conductor. It is particularly applicable for use in the gas pipeline industry to locate electrical shorts between buried structures. The relative instantaneous current flow direction is determined by comparing the instantaneous polarity of a received signal with that of a reference signal, wherein the reference signal is phase locked with a test signal.

Figure 1:
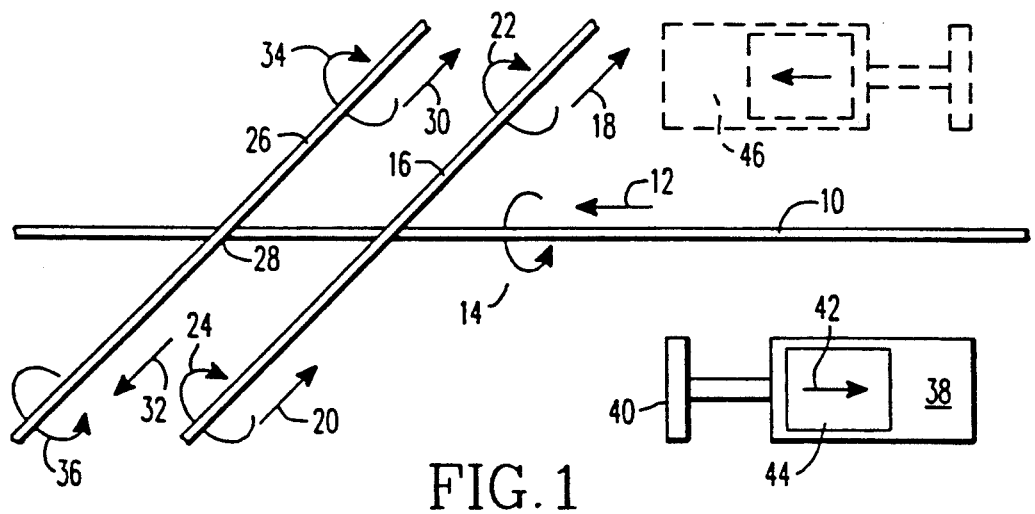
FIG. 1 is a schematic diagram which illustrates the principal of operation of the present invention.

FIG. 1 is a schematic diagram of a typical pipeline arrangement as seen from above, which demonstrates how the invention can be used to find electrical shorts between pipelines. A transmitter, not shown, is used to apply an AC test signal to a first pipeline 10 in accordance with known techniques. The test signal should have a stable frequency and low noise. Its frequency should be high enough to generate a sufficiently large field to be detected, but low enough to avoid inductive coupling to other structures which may be insulated at DC. It is also desirable that the test signal frequency lies between power frequency harmonics.

The test signal creates a current in the pipeline having an instantaneous polarity as illustrated by arrow 12 and producing an instantaneous magnetic field illustrated by arrow 14. An adjacent pipeline 16 passes over pipeline 10 without physical contact between the pipelines. The test signal on line 10 is coupled to line 16 to produce a signal in line 16 in which the instantaneous polarity of the current is illustrated by arrows 18 and 20 and the instantaneous polarity of the associated magnetic field is illustrated by arrows 22 and 24. In this case, pipeline 16 serves as a ground return for the test signal to the transmitter.

A second adjacent pipeline 26 is shown to be in physical contact with pipeline 10 at point 28. In this case, the test signal is again conductively coupled between pipelines 10 and 26 and the instantaneous polarity of the current is illustrated by arrows 30 and 32, while the instantaneous polarity of the associated magnetic field is illustrated by arrows 34 and 36.

An instrument 38 for locating electrical shorts between buried conductive elements in accordance with this invention includes a horizontal antenna 40 that measures the horizontal component of the electromagnetic flux coming from the pipeline and compares it to an internal frequency reference signal. An arrow 42 on a display 44 of the instrument indicates the relative direction of the current of the signal in the pipeline as determined by a phase comparison between the instantaneous polarities of the detected signal and the internal frequency reference signal. Reversing the direction of the instrument causes the phase between the internal frequency reference and the horizontal antenna to shift by 180°, however, the direction arrow remains in the same relative position as illustrated by the phantom view 46 of the instrument in FIG. 1.

A crossing pipeline can be expected to carry the test signal, either as a result of an electrical short between the pipelines or as a ground return signal for the test signal to the transmitter. The instrument can determine whether or not there is a short between the pipelines by measuring the current flow direction on either side of the pipe under test. If the current direction on the crossing pipeline is different on opposite sides of the first pipeline, then there is a short between the pipelines. If the current direction of the crossing pipeline is the same on opposite sides of the pipeline under test, then the current on the crossing pipeline is due to ground return and there is no electrical short between the pipelines.

Figure 2:
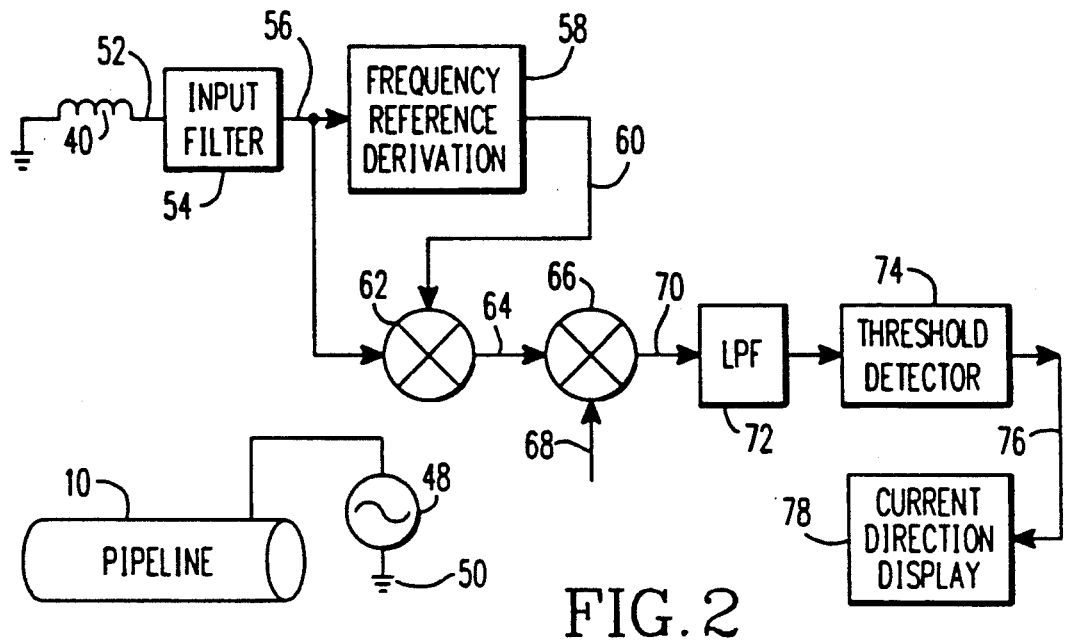
FIG. 2 is a block diagram which illustrates the principal components of an instrument constructed in accordance with this invention.

FIG. 2 is a block diagram of the short locating instrument 38 in FIG. 1. A transmitter 48, grounded to an earth ground 50, applies an AC test signal to the pipeline 10 to be tested. The pipeline radiates electromagnetic flux from the test signal which is received by the horizontal antenna 40 of the instrument. This horizontal antenna normally measures the flux component that is parallel to the ground and perpendicular to the pipeline. The antenna output signal on line 52 is preprocessed by an input filter 54 to improve the signal to noise ratio and to remove any DC bias from the input. The preprocessed signal on line 56 is presented to a frequency reference derivation circuit block 58. This block creates a frequency reference signal which is a signal at the same frequency as the test signal and constrained so that it is phase locked with the test signal at one of two stable points. These points represent a phase shift between the test signal and the reference signal of either zero or 180°. Two stable operating points are required to accommodate a change in orientation of the instrument made by an operator. Block 58 must be robust enough to maintain the phase lock to the test signal through moderate dropouts.

The frequency reference signal on line 60 is multiplied by the preprocessed signal on line 56 at multiplication point 62 to yield a signal on line 64 whose DC component is an indication of the phase shift between the reference signal and the test signal, and thus the relative current direction on the pipeline. This phase shift indicating signal is multiplied at point 66 by an alignment signal on line 68 which may invert the signal as a direction initialization. The alignment signal is a binary signal which allows the initial direction of the direction indicating arrow to be set. The resulting signal on line 70 is passed through a low pass filter 72 which removes high frequency components. A threshold detector 74 interprets the output of the low pass filter as a current direction and supplies an indicating signal on line 76 to a display 78. The threshold detector will indicate that the current is in one direction if the DC output of the low pass filter is above a certain threshold. The indicated current direction is reversed if the DC output of the low pass filter is below the negation of the threshold. If the magnitude of the output of the low pass filter is less than the threshold, the current direction is indeterminant.

Figure 3:
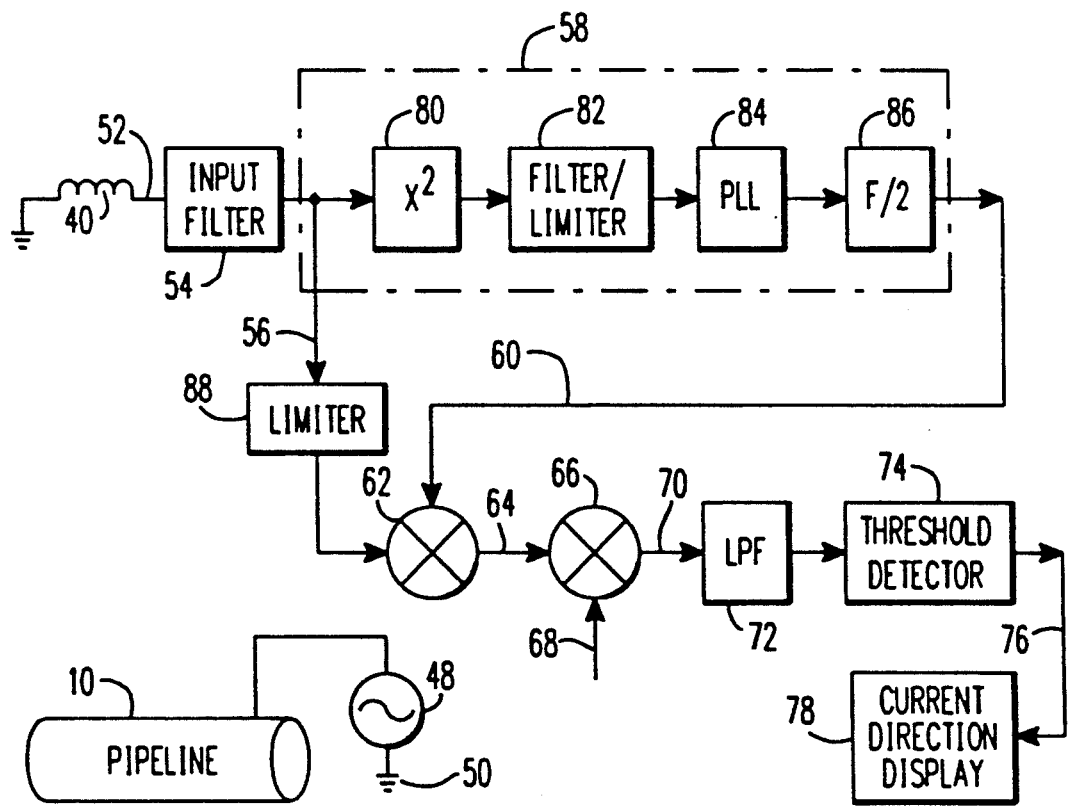
FIG. 3 is a more detailed block diagram of the instrument of FIG. 2.
Figure 1:
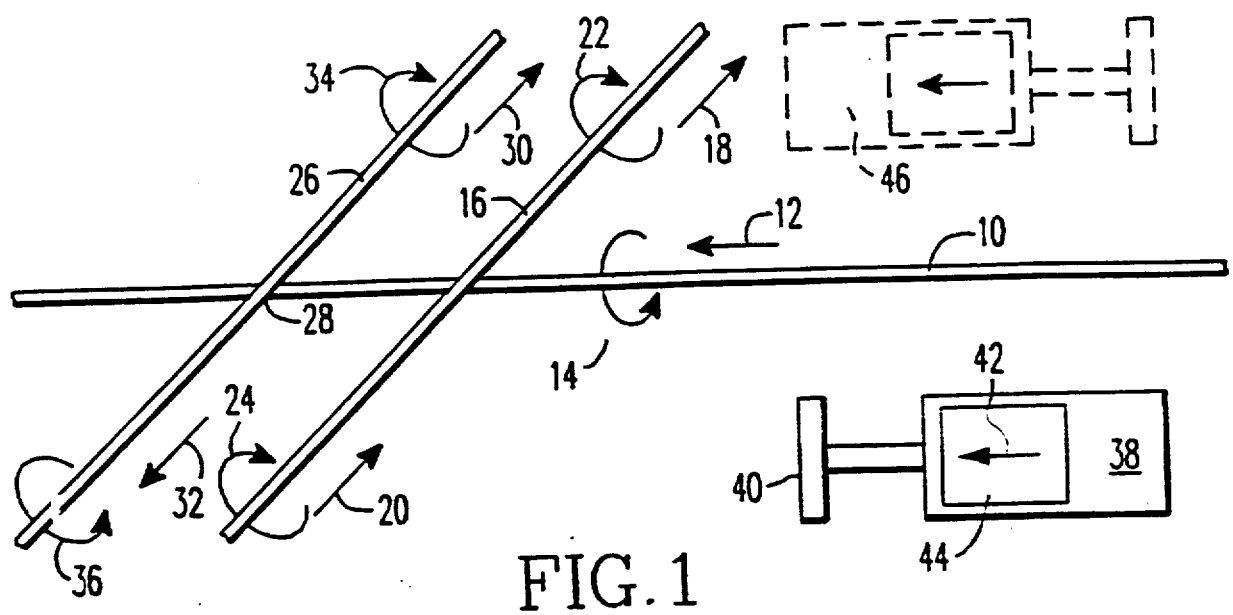

FIG. 3 is a more detailed block diagram of the instrument of FIG. 2. The input filter 54 in the preferred embodiment includes an analog band pass filter, centered at the test signal frequency, and a digital comb notch filter arranged in cascade. The comb notch filter removes power line frequency interference. The derivation of the frequency reference signal in block 58 is accomplished in the preferred embodiment by squaring the signal on line 56 as illustrated by block 80, filtering and limiting the signal as illustrated by block 82, passing the signal through a phase lock loop 84, and dividing the frequency of the resulting phase locked signal by 2 as illustrated by block 86.

The squaring block performs a squaring operation on the signal, yielding a signal with a frequency component at twice the original test signal frequency and a fixed phase relationship. In addition to doubling the frequency, the squaring operation also adds an undesirable DC component to the signal. Since the squaring operation is nonlinear, the signal and any added noise are no longer statistically independent. These undesirable effects are removed by the filter/limiter. It converts the real valued signal to a binary signal with possible values of +1 and −1. The decision level for this comparison is at the mean value of the input signal. The output of the filter/limiter is a square wave with a zero mean value. A binary signal is used to simplify subsequent processing. It should be understood that other types of signal processing may be used without going beyond the scope of this invention.

The phase locked loop 84 is tuned to lock on to the frequency doubled, filtered test signal from the filter/limiter. It has an optimized second order transient response and a very small bandwidth so that it can maintain phase lock through moderate signal dropouts. The frequency halving block 86 is a simple divide by 2 clocking circuit which converts the phase locked loop output to the frequency reference signal at the same frequency and in phase with the test signal.

The signal on line 56 is limited by limiter 88 before being multiplied by the frequency reference signal, in order to simplify the processing in the remainder of the circuit. The limiter converts the input to a binary u signal with a zero mean value and possible values of +1 and −1. With this change, it is possible to implement the multiplication operations shown in the block diagram by using boolean exclusive OR operations. The low pass filter 72 can be implemented as an accumulator that is periodically latched to the threshold detector and cleared. The output of the threshold detector is calculated periodically.

It should be apparent that instruments constructed in accordance with this invention can be used to perform a method for determining the spacial relationship between buried conductors wherein a test signal is coupled to a first elongated buried conductor and the test signal is coupled to a second elongated concealed conductor, adjacent to the first conductor. A relative direction of the current of the test signal on the second conductor is measured on opposite sides of the first conductor and an indication of the relative directions of the test signal at the measurement locations is provided. If the relative direction is the same on both sides of the first conductor, the two conductors are separated from each other. If the relative directions are opposite on the two sides of the first conductor, the two conductors are in physical contact with each other.

Figure 4:
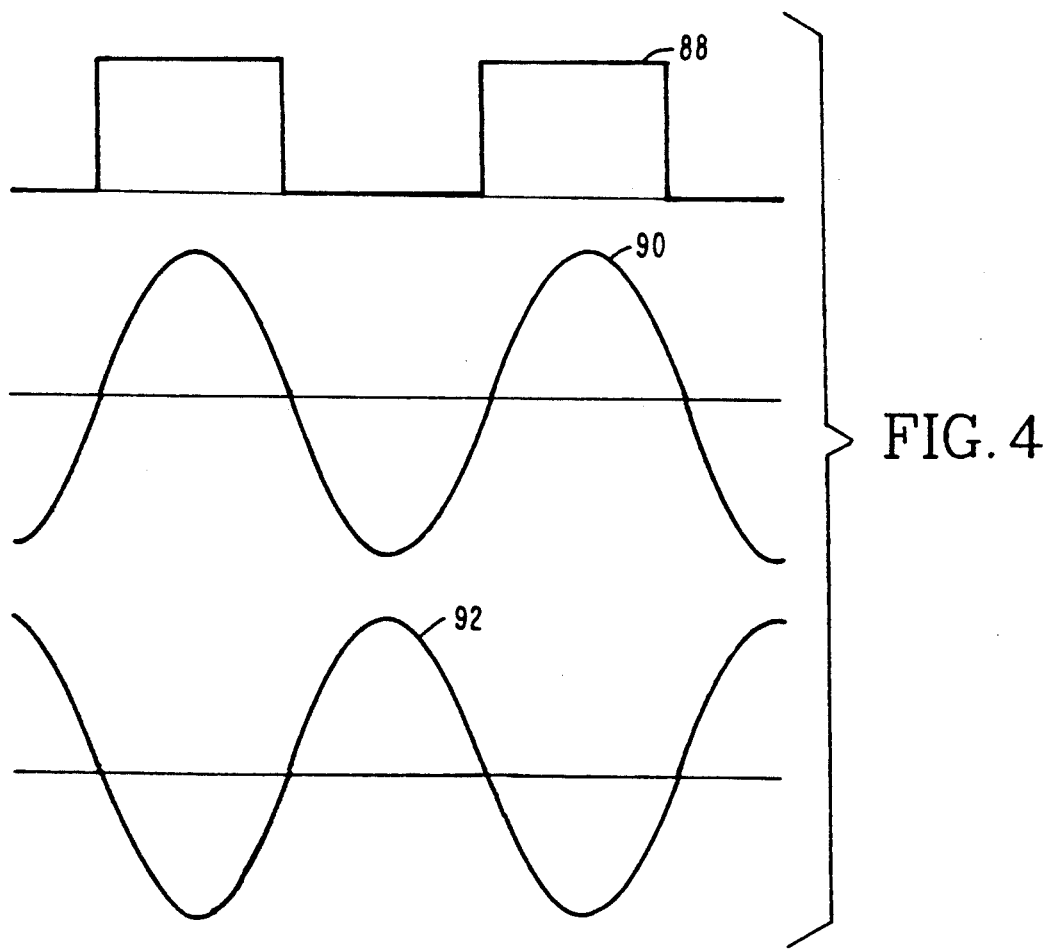
FIG. 4 is a series of waveforms which illustrate the operation of the invention.

FIG. 4 is a series of waveforms which illustrate the operation of the invention. Waveform 88 represents the internally generated reference signal which is phase locked to the test signal, either as applied to the first concealed conductor or as radiated from the second concealed conductor. Waveforms 90 and 92 represent the measured signal for cases where the measured signal is respectively in phase and out of phase with the test signal. If the phase relationship between the reference signal and the measured signal is the same on opposite sides of the first concealed conductor, then the crossing conductor is separated from the first concealed conductor. If the phase relationship between the reference signal and the measured signal on opposite sides of the first concealed conductor is different, then the conductors are in contact with each other.

Although the present invention has been described in terms of its preferred embodiments, it will be apparent to those skilled in the art that various changes may be made without departing from the scope of the invention. It is therefore intended that the appended claims cover such changes.

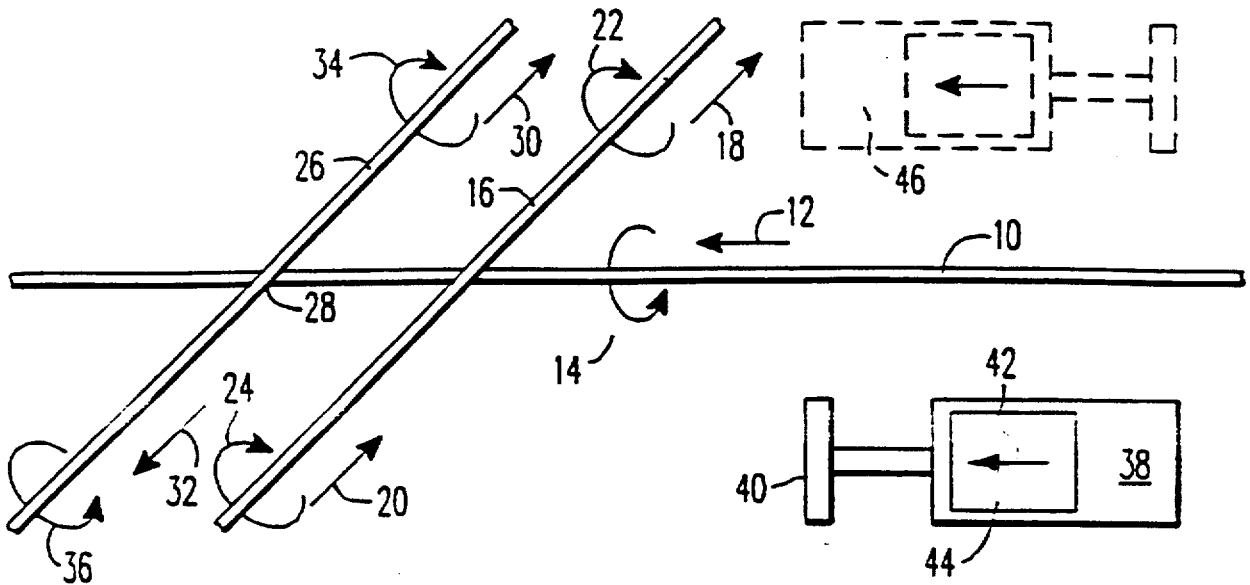

What is claimed is:

1. A method of determining the spacial relationship between concealed conductors, said method comprising the steps of:
    coupling a first signal to a first elongated concealed conductor, said first signal being coupled to a second elongated concealed conductor;
    measuring the relative direction of current of said first signal on said second conductor on opposite sides of said first conductor; and
    displaying the relative directions of current of said first signal to indicate that said first and second conductors are in contact with each other if the relative directions of current are opposite or that said first and second conductors are separated from each other if the relative directions of current are the same.

2. A method of determining the spacial relationship between concealed conductors, as recited in claim 1, wherein the step of measuring the relative direction of current of said first signal comprises the steps of:
    producing a reference signal which is phase locked with a first signal at either of a first location or a second location;
    receiving said first signal radiated from said second concealed conductor at said first and second locations; and
    comparing the phase of said reference signal with the phase of said first signal at said first and second locations on opposite sides of said first conductor to obtain an indication of the relative directions of current of said first signal at said first and second locations.

3. A method of determining the spacial relationship between concealed conductors, as recited in claim 2, wherein:
    said reference signal is produced in response to a horizontal component of electromagnetic flux of said first radiated signal.

4. A method of determining the spacial relationship between concealed conductors, as recited in claim 2, wherein:
    said reference signal is phase locked to said first signal at one of two stable points in each cycle of said first signal.

5. A method of determining the spacial relationship between concealed conductors, as recited in claim 2, wherein said step of producing a reference signal comprises the steps of:
    receiving a component of said first signal;
    doubling the frequency of the received component to produce a double frequency signal;
    producing a control signal which is phase locked with said double frequency signal; and
    dividing the frequency of said control signal by two to produce said reference signal.

6. An apparatus for determining the spacial relationship between concealed conductors comprising:
    means for coupling a first signal to a first elongated concealed conductor, said first signal being coupled to a second elongated concealed conductor;
    means for measuring the relative direction of current of said first signal on said second conductor on first and second sides of said first conductor; and
    means for displaying the relative directions of current of said first signal to indicate that said first and second conductors are in contact with each other if the relative directions of current are opposite or that said first and second conductors are separated from each other if the relative directions of current are the same.

7. An apparatus for determining the spacial relationship between concealed conductors, as recited in claim 6, wherein the means for measuring the relative directions of current of said first signal comprises:
    means for producing a reference signal which is phase locked with a first signal at either of a first location or a second location;
    means for receiving said first signal radiated from said second concealed conductor at said first and second locations; and
    means for comparing the phase of said reference signal with the phase of said first signal at said first and second locations on opposite sides of said first conductor to obtain an indication of the relative directions of current of said first signal at said first and second locations.

8. An apparatus for determining the spacial relationship between concealed conductors, as recited in claim 7, wherein:
    said reference signal is produced in response to a horizontal component of electromagnetic flux of said first radiated signal.

9. An apparatus for determining the spacial relationship between concealed conductors, as recited in claim 7, wherein:
    said reference signal is phase locked to said first signal at one of two stable points in each cycle of said first signal.

10. An apparatus for determining the spacial relationship between concealed conductors, as recited in claim 7, wherein said means for producing a reference signal comprises:
    means for receiving a component of said first signal;
    means for doubling the frequency of the received component to produce a double frequency signal;
    means for producing a control signal which is phase locked with said double frequency signal; and
    means for dividing the frequency of said control signal by two to produce said reference signal.

11. A method of determining the spacial relationship between concealed conductors, said method comprising the steps of:
    producing a reference signal which is phase locked with a first signal radiated from a first concealed conductor;
    receiving a second signal radiated from a second concealed conductor, said second signal being radiated in response to coupling between said first and second concealed conductors;
    comparing the phase of said reference signal with the phase of said second signal at first and second locations on opposite sides of said first conductor; and displaying an indication of contact or separation between said first and second conductors based on the phase relationship of said reference signal and said second signal at said first and second locations.

12. A method of determining the spacial relationship between concealed conductors, as recited in claim 11, wherein:
said reference signal is produced in response to a horizontal component of electromagnetic flux of said first radiated signal.

13. A method of determining the spacial relationship between concealed conductors, as recited in claim 11, wherein:
said reference signal is phase locked to said first signal at one of two stable points in each cycle of said first signal.

14. A method of determining the spacial relationship between concealed conductors, as recited in claim 11, wherein said step of producing a reference signal comprises the steps of:
receiving a component of said first signal;
doubling the frequency of the received component to produce a double frequency signal;
producing a control signal which is phase locked with said double frequency signal; and
dividing the frequency of said control signal by two to produce said reference signal.

15. A method of determining the spacial relationship between concealed conductors, as recited in claim 11, wherein:
an indication of contact between said first and second conductors is displayed if said phase of said reference signal and said phase of said second signal are the same at said first and second locations; and
an indication of separation between said first and second conductors is displayed if said phase of said reference signal and said phase of said second signal are different at said first and second locations.

16. A method of determining the spacial relationship between concealed conductors, said method comprising the steps of:
producing a reference signal which is phase locked with a first signal radiated from a first concealed conductor;
receiving a second signal radiated from a second concealed conductor, said second signal being radiated in response to coupling of said first signal between said first and second concealed conductors;
comparing the instantaneous polarity of said reference signal with the instantaneous polarity of said second signal at first and second locations on opposite sides of said first conductor; and
displaying an indication of contact between said first and second conductors if said instantaneous polarity of said reference signal and said instantaneous polarity of said second signal are the same at said first and second locations, or displaying an indication of separation between said first and second conductors if said instantaneous polarity of said reference signal and said instantaneous polarity of said second signal are different at said first and second locations.

17. A method of determining the spacial relationship between concealed conductors as recited in claim 16, wherein said step of producing a reference signal comprises the steps of:
receiving said first radiated signal from said first concealed conductor;
doubling the frequency of the received first radiated signal; and
generating said reference signal, said reference signal being phase locked to said frequency doubled received first radiated signal.

18. An instrument for determining the spacial relationship between concealed conductors, said instrument comprising:
means for producing a reference signal which is phase locked with a first signal radiated from a first concealed conductor;
means for receiving a second signal radiated from a second concealed conductor, said second signal being radiated in response to coupling of said first signal to said second conductor;
means for comparing the instantaneous polarity of said reference signal with the instantaneous polarity of said second signal at first and second locations on opposite sides of said first concealed conductor; and
means for displaying an indication of contact between said first and second conductors if said instantaneous polarity of said reference signal and said instantaneous polarity of said second signal are the same at said first and second locations, or displaying an indication of separation between said first and second conductors if said instantaneous polarity of said reference signal and said instantaneous polarity of said second signal are different at said first and second locations.

19. A method of determining the spacial relationship between concealed conductors, said method comprising the steps of:
producing a reference signal which is phase locked with a first signal radiated from a first concealed conductor;
receiving a second signal radiated from a second concealed conductor, said second signal being radiated in response to coupling of said first signal between said first and second concealed conductors;
comparing the phase of said reference signal with the phase of said second signal at first and second locations on opposite sides of said first conductor; and
displaying an indication of contact between said first and second conductors if said phase of said reference signal and said phase of said second signal are the same at said first and second locations, or displaying an indication of separation between said first and second conductors if said phase of said reference signal and said phase of said second signal are different at said first and second locations.

* * * * *

UNITED STATES PATENT AND TRADEMARK OFFICE
CERTIFICATE OF CORRECTION

PATENT NO. : 5,194,816

DATED : March 16, 1993

Page 1 of 3

INVENTOR(S) : David S. Steele

It is certified that error appears in the above-identified patent and that said Letters Patent is hereby corrected as shown below:

The title page should be deleted to appear as per attached title page.

Figure 1 should be deleted to be replaced with figure 1 as shown on the attached sheet.

Signed and Sealed this

Seventeenth Day of January, 1995

Attest:

BRUCE LEHMAN

Attesting Officer

Commissioner of Patents and Trademarks

United States Patent [19]

Steele

[11] Patent Number: 5,194,816
[45] Date of Patent: Mar. 16, 1993

[54] METHOD AND APPARATUS FOR LOCATING ELECTRICAL SHORTS BETWEEN CONCEALED CONDUCTIVE OBJECTS

[75] Inventor: David S. Steele, Wyoming, Ohio

[73] Assignee: Westinghouse Electric Corp., Pittsburgh, Pa.

[21] Appl. No.: 600,464

[22] Filed: Oct. 19, 1990

[51] Int. Cl.⁵ .............................................. G01R 31/08
[52] U.S. Cl. .................................. 324/529; 324/527; 324/521
[58] Field of Search .......................... 324/67, 520–524, 324/527–529, 326, 327, 133

[56] References Cited

U.S. PATENT DOCUMENTS

| | | |
|---|---|---|
| 3,617,865 | 11/1971 | Hakata . |
| 3,991,363 | 11/1976 | Lathrop . |
| 4,039,938 | 8/1977 | Link . |
| 4,186,338 | 1/1980 | Fichtenbaum .................. 324/529 X |
| 4,220,913 | 9/1980 | Howell et al. . |
| 4,387,340 | 6/1983 | Peterman . |
| 4,427,942 | 1/1984 | Sole . |
| 4,438,389 | 3/1984 | De Sa . |
| 4,520,317 | 5/1985 | Peterman . |
| 4,639,674 | 1/1987 | Rippingale . |
| 4,686,454 | 8/1987 | Pecukonis . |

*Primary Examiner*—Jack B. Harvey
*Attorney, Agent, or Firm*—R. P. Lenart

[57] ABSTRACT

A method for determining the spacial relationship between concealed elongated conductors wherein a test signal is coupled to a first concealed conductor and conductively coupled to a second adjacent concealed conductor. The relative direction of the current of the test signal on the second conductor is measured on opposite sides of the first conductor. An indication of the relative directions of the current of the test signal on opposite sides of the first conductor can be used to determine if the two conductors are separated or in contact with each other. If the relative direction of the test signal radiated from the second conductor is the same on opposite sides of the first conductor, then the two conductors are separated from each other. If the relative direction of the test signal radiated from the second conductor is opposite on opposite sides of the first conductor, then the two conductors are in contact with each other.

19 Claims, 2 Drawing Sheets